(12) United States Patent
Peter et al.

(10) Patent No.: US 12,235,320 B2
(45) Date of Patent: Feb. 25, 2025

(54) SAFETY SWITCHING APPARATUS, IN PARTICULAR FOR THE MONITORED SWITCHING ON OF AN ELECTRICAL AND/OR ELECTRONIC LOAD

(71) Applicant: Phoenix Contact GmbH & Co. KG, Blomberg (DE)

(72) Inventors: Henry Peter, Einbeck (DE); Felix Franke, Bad Pyrmont (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 139 days.

(21) Appl. No.: 18/142,439

(22) Filed: May 2, 2023

(65) Prior Publication Data

US 2023/0358807 A1  Nov. 9, 2023

(30) Foreign Application Priority Data

May 3, 2022  (DE) .......................... 102022110812.0

(51) Int. Cl.
| | |
|---|---|
| *G01R 31/327* | (2006.01) |
| *G01R 15/22* | (2006.01) |
| *G01R 19/00* | (2006.01) |
| *H02H 3/02* | (2006.01) |

(52) U.S. Cl.
CPC .......... *G01R 31/327* (2013.01); *G01R 15/22* (2013.01); *G01R 19/0092* (2013.01); *H02H 3/02* (2013.01)

(58) Field of Classification Search
USPC ....................................................... 324/415
See application file for complete search history.

(56) References Cited

U.S. PATENT DOCUMENTS

2020/0096571 A1* 3/2020 Hanai ................ G01R 31/3278

FOREIGN PATENT DOCUMENTS

| DE | 1924461 A1 | 11/1970 |
|----|----|----|
| DE | 3214365 A1 | 10/1983 |
| DE | 254074 A1 | 2/1988 |
| DE | 3642233 A1 | 6/1988 |
| DE | 19913933 A1 | 10/1999 |
| EP | 1081431 A2 | 3/2001 |
| EP | 1861860 B1 | 12/2007 |

(Continued)

OTHER PUBLICATIONS

European Search Report issued in EP Patent Application No. 23169242.7 on Oct. 16, 2023 and English Translation thereof.

*Primary Examiner* — Farhana A Hoque
(74) *Attorney, Agent, or Firm* — Kaplan Breyer Schwarz, LLP

(57) ABSTRACT

A safety switching apparatus for safely switching on an electrical load includes for this purpose, the functionality of two non-forcibly guided changeover switches and, in particular, their normally closed contacts, which can be monitored during a starting process without using a microcontroller. The normally closed contacts are each arranged in a separate diagnostic circuit, which are connected in parallel with respect to a test voltage. The diagnostic circuits are each monitored by a diagnostic current detection device. The excitation coils of the changeover switches can each be short-circuited via a short-circuit device if a diagnostic current continues to flow in the respective diagnostic circuit for a predetermined time period after an activated starting process.

8 Claims, 3 Drawing Sheets

(56) References Cited

FOREIGN PATENT DOCUMENTS

| | | | |
|---|---|---|---|
| EP | 1869687 | A1 | 12/2007 |
| EP | 2089892 | A1 | 8/2009 |
| EP | 3575900 | A1 | 12/2019 |

\* cited by examiner

SAFETY SWITCHING APPARATUS, IN PARTICULAR FOR THE MONITORED SWITCHING ON OF AN ELECTRICAL AND/OR ELECTRONIC LOAD

RELATED APPLICATION

This application claims the priority benefit of German Application No. 10 2022 110 812.0, filed May 3, 2022, the entire disclosure of which is incorporated herein by reference.

FIELD

The invention relates to a safety switching apparatus, in particular for the monitored switching on or connecting to a supply voltage of an electrical and/or electronic load. The safety switching apparatus can preferably be used in industrial automated process control systems.

BACKGROUND

Safety switching apparatuses are used in particular to either drive electrical and/or electronic loads to a safe state or to switch them off completely when a fault occurs, in order to protect operating personnel from injury and damage to health and to prevent damage to or destruction of equipment. In order to be able to ensure safe operation of a safety switching apparatus, such safety switching apparatuses are, for example, redundantly constructed in that two switching elements are connected in series with each other in at least one load current path. Only when the load current path is closed by both switching elements can an electrical and/or electronic load be switched on or connected to a supply voltage. Usually, single-phase or multi-phase loads can be connected to a single-phase or multi-phase supply voltage via a safety switching apparatus. In order to be able to ensure proper operation, the switching elements in particular must be monitored for their functionality. It is known that the switching elements are monitored with the aid of an evaluation and control unit designed as a microcontroller.

Such a safety switching apparatus for safely switching off an electrical load is known from EP 1 869 687 B1. The known safety switching apparatus has, among other things, two changeover switches arranged in series with one another, which are assigned to a power supply path via which an electrical load can be connected to or disconnected from a supply voltage. The evaluation and control unit, which is designed as a microcontroller, is used to perform function tests at defined times, in particular before the power supply path to the load is closed.

SUMMARY

The invention is based on the task of providing a safety switching apparatus which can be used to monitor the functionality of non-forcibly guided changeover switches in a reliable and cost-effective manner.

A core idea of the invention can be seen in providing a safety switching apparatus with which, when a fault is detected, in particular a starting process for switching on or connecting to a supply voltage of an electrical load can be aborted. For this purpose, the functionality of, for example, two non-forcibly guided changeover switches and, in particular, their normally closed contacts can preferably be monitored during a starting process without using a microcontroller. The normally closed contacts, also known as break contacts, are each arranged in a separate diagnostic circuit, with the diagnostic circuits being connected in parallel with respect to a test voltage. The normally open or make contacts of the changeover switches are arranged in series with one another in a load circuit. Preferably, a circuit arrangement, which preferably implements a logic circuit, is used to control and monitor the changeover switches, which only has active, and possibly passive, discrete electrical components such as, for example, ohmic resistors, semiconductor switches and capacitors. It should be noted that the changeover switches can, for example, be designed as changeover relays.

The above-mentioned technical problem is solved by the features of claim 1. Advantageous embodiments are the subject of the subclaims.

Accordingly, a safety switching apparatus is provided in particular for the monitored connecting of an electrical and/or electronic load to a supply voltage. The safety switching apparatus can preferably have a first and a second input, to each of which an activation signal can be applied or supplied. The activation signal can be a sensor signal from a signal generator or, for example, a supply voltage that is used to supply current to an excitation coil.

Furthermore, the safety switching apparatus can have a third input to which a supply voltage can be applied or supplied for supplying power to the electrical and/or electronic load. The supply voltage can be a DC or AC voltage.

Furthermore, the safety switching apparatus can have a test voltage supply device, which preferably supplies a DC voltage. The safety switching apparatus can have an output to which the electrical and/or electronic load can be connected, with a load current path running between the third input and the output.

It should already be noted at this point that several outputs for connecting a multiphase electrical load and several third inputs for applying a multiphase supply voltage can also be provided, between which a load current path runs in each case. In this way, a single-phase or also a multi-phase electrical load can be connected to the safety switching apparatus.

The safety switching apparatus may further include first and second changeover switches, each having an excitation coil, a normally closed contact, a normally open contact, and a common center terminal, also referred to as a root. The two changeover switches may be provided, for example, as changeover relays.

The first changeover switch and the second changeover switch are preferably electrically connected to each other by means of the respective common center terminals. In this way, the normally open contacts of the first and second changeover switches are arranged in series with each other in the load current path. The excitation coil of the first changeover switch is arranged in a first control current path electrically connected to the first input, while the normally closed contact of the first changeover switch is arranged in a first diagnostic circuit. The excitation coil of the second changeover switch is arranged in a second control current path electrically connected to the second input, while the normally closed contact of the second changeover switch is arranged in a second diagnostic circuit. The first diagnostic circuit and the second diagnostic circuit are connected in parallel to the test voltage supply device.

The safety switching apparatus can further comprise a first diagnostic current detection device, which is associated with or operatively connected to the first diagnostic circuit. It is adapted to provide a first control signal only when the first diagnostic circuit is closed by means of the normally closed contact of the first changeover switch. The first control signal thus indicates that a diagnostic current is flowing in the first diagnostic circuit.

Furthermore, a second diagnostic current detection device can be provided, which is associated with or operatively connected to the second diagnostic circuit. It is adapted to provide a second control signal only when the second diagnostic circuit is closed by means of the normally closed contact of the second changeover switch. The second control signal thus indicates that a diagnostic current is flowing in the second diagnostic circuit.

The safety switching apparatus may further comprise a first controllable short-circuit device which is electrically connectable to the second input. Furthermore, a second controllable short-circuit device can be provided which is electrically connectable to the first input. Preferably, the first short-circuit device is adapted to short-circuit the excitation coil of the first changeover switch in response to a first activation signal applied to the second input only when the second diagnostic current detecting device provides the second control signal during a predetermined time period after the first activation signal is applied. The second short-circuit device may be adapted to short-circuit the excitation coil of the second changeover switch in response to a second activation signal applied to the first input only when the first diagnostic current detection device provides the first control signal during a predetermined time period after the second activation signal is applied.

Thanks to this mechanism, the safety switching apparatus starts monitoring the changeover switches at the beginning of the startup process, i.e. at the time when an activation signal, e.g. a supply voltage, has been applied to the first and second inputs respectively. It should be noted that the monitoring is performed without the use of a microcontroller.

Preferably, the first and second diagnostic current detection devices each comprise an optocoupler.

In order to be able to supply a floating test voltage, the test voltage supply device can have a transmitter or transformer, wherein the transmitter can be connected on the primary side to a DC/AC converter or an AC/AC converter and on the secondary side to an AC/DC converter. A DC/AC converter would preferably be connected to an external DC voltage source.

In an advantageous embodiment, the first short-circuit device may comprise a switching element for short-circuiting the excitation coil of the first changeover switch and an RC element having a time constant that defines the predetermined time period. Similarly, the second short-circuit device may comprise a switching element for short-circuiting the excitation coil of the second changeover switch and an RC element having a time constant that defines the predetermined time period. The RC elements may each be designed, for example, as a low-pass filter.

According to an advantageous embodiment, a first switching element may be connected in series with the excitation coil of the first changeover switch, wherein the first switching element is adapted to open and close the first control current path. Further, a second switching element may be connected in series with the excitation coil of the second changeover switch, the second switching element being adapted to open and close the second control current path. Further, a logic circuit may be provided that may be adapted to close the first switching element and the second switching element only when the first and second activation signals, a start signal, and the first and second control signals are simultaneously applied to the logic circuit. In this case, the first short-circuit device may be adapted to short-circuit the excitation coil of the first changeover switch only when the second diagnostic current detecting means still provides or supplies the second control signal during the predetermined time period after the second switching element is closed. In addition, the second short-circuit device may be adapted to short-circuit the excitation coil of the second changeover switch only when the first diagnostic current detecting means still provides the second control signal during the predetermined time period after the first switching element is closed. It should be noted that the logic circuit is preferably constructed only of active, and optionally of passive, discrete electrical components, such as npn and pnp transistors, electrical resistors and capacitors.

Thanks to this mechanism, the safety switching apparatus starts monitoring the changeover switches at the beginning of the start process, i.e. at the time when a start signal has been applied and an activation signal, e.g. a supply voltage, has been applied to the first and second inputs respectively.

According to an advantageous implementation, the monitoring of the two changeover switches starts with a time delay, i.e. the functionality of the first changeover switch is checked first and then the functionality of the second changeover switch, or vice versa. For this purpose, the logic circuit can be adapted to close the first switching element and, with a time delay, the second switching element, or vice versa. However, the two changeover switches can also be monitored simultaneously.

It should be noted that the monitoring of the switching on of the electrical and/or electronic load is performed without the use of a microcontroller.

According to an advantageous embodiment, the first short-circuit device may comprise a further switching element having a first terminal electrically connected to the output of the second diagnostic current detection device and a second terminal electrically connectable to the second input. Preferably, the further switching element serves to activate the first short-circuit device if a diagnostic current flows in the first diagnostic circuit. Moreover, the second short-circuit device may comprise a further switching element having a first terminal electrically connected to the output of the first diagnostic current detection device and a second terminal electrically connectable to the first input. The further switching element preferably serves to activate the second short-circuit device if a diagnostic current flows in the second diagnostic circuit.

BRIEF DESCRIPTION OF THE DRAWINGS

The invention is explained in more detail below with reference to exemplary embodiments in conjunction with the accompanying drawings. Therein show.

DETAILED DESCRIPTION

Figure 1A:
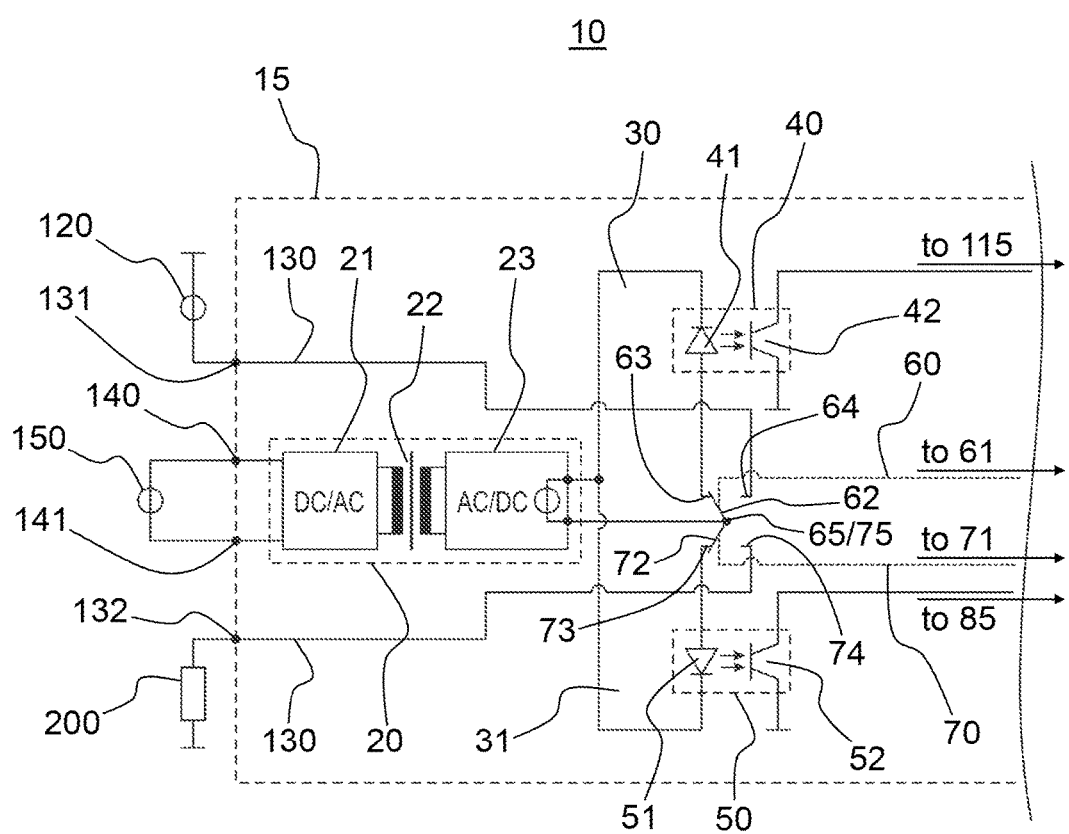
FIG. 1A the first part of an exemplary safety switching apparatus according to the invention, and FIG. 1B the second part of the exemplary safety switching apparatus according to the invention, and FIG. 2 an exemplary circuit arrangement of the logic circuit shown in FIG. 1B
Figure 1B:
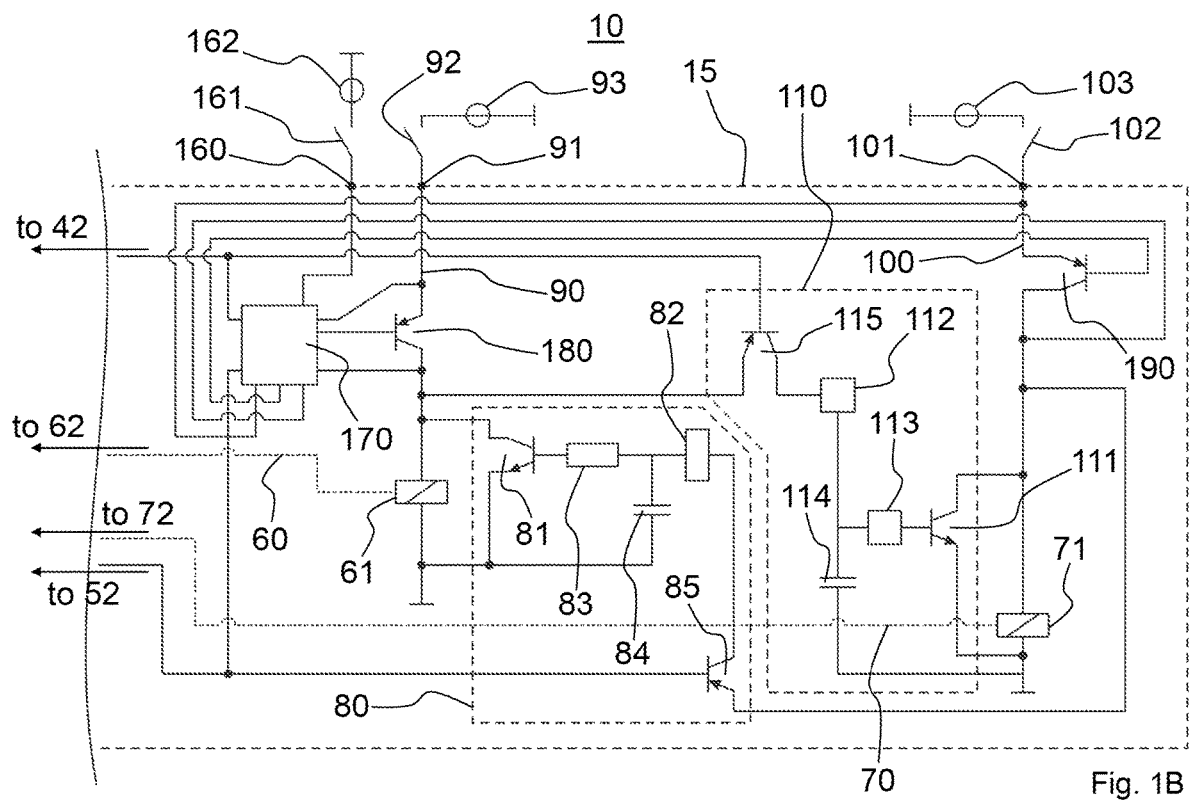

Reference is made to FIGS. 1A and 1B, which together show an exemplary safety switching apparatus 10 that can be used, for example, in an industrial automation environment, such as in an automated process control system. The exemplary safety switching apparatus 10 is preferably capable of monitoring the functionality of the safety switching apparatus and in particular the functionality of non-forcibly guided changeover switches during a starting process for the monitored switching on of an electrical and/or electronic load 200, i.e. preferably for the monitored connecting of an electrical and/or electronic load 200 to a supply voltage, and of aborting the starting process if an error occurs.

As shown in FIGS. 1A and 1B, the safety switching apparatus 10 may be arranged in a housing 15 shown in dashed lines. As further shown in FIG. 1B, the safety switching apparatus 10 has, for example, a first input 91 to which an activation signal may be applied, for example upon actuation of a sensor 92. The sensor 92 may be, for example, a switch or pushbutton. According to an advantageous implementation, a voltage source 93 may be connected to the first input 91. In the present example, the voltage source 93 is a DC voltage source, which may provide 24 V, for example. In this case, the activation signal corresponds to the applied DC voltage. Furthermore, the safety switching apparatus 10 may have a second input 101 to which also an activation signal may be applied, for example, upon actuation of a sensor 102. The sensor 102 may be, for example, a switch or pushbutton. According to the advantageous implementation, a voltage source, for example a DC voltage source 103 can be applied to the second input 101 via the push button 102. In this case, the activation signal also corresponds to the applied DC voltage. In other words, a DC voltage is thus applied as the activation or sensor signal to the first input 91 and in the second input 101, respectively, when the exemplary pushbuttons 92 and 102 are actuated.

As shown in FIG. 1A, the safety switching apparatus 10 may have a third input 131 to which a supply voltage for powering an electrical and/or electronic load 200 may be applied. The supply voltage is preferably provided by a voltage source 120, which may be a DC voltage source or an AC voltage source. Furthermore, the safety switching apparatus 10 preferably comprises an output 132 to which the electrical and/or electronic load 200 can be connected. As can be seen in FIG. 1A, a load current path 130 extends between the third input 131 and the output 132. It should already be noted at this point that several third inputs 131 and several outputs 132 can also be provided if, instead of a single-phase electrical load, also a multi-phase electrical load is to be connected. In this case, a load current path extends between each third input and each output.

The exemplary safety switching apparatus 10 preferably comprises a test voltage supply device 20 that can be connected on the input side to an external voltage source via two input terminals 140 and 141. The voltage source 150 may be an AC or DC voltage source. In order to be able to provide a floating test voltage, the test voltage supply device 20 may comprise a transmitter 22 to which a DC/AC converter 21 is connected on the primary side if, as shown, the voltage source 150 is a DC voltage source. Otherwise, an AC/AC converter may be connected on the primary side. On the input side, the DC/AC converter 21 is connected to inputs 140 and 141. On the secondary side, an AC/DC converter 23 can be connected to the transmitter 22, which supplies a floating DC voltage as a test voltage on the output side. The DC voltage is symbolically represented by a DC voltage source in the AC/DC converter 23.

Preferably, the exemplary safety switching apparatus 10 comprises a first changeover switch 60 having an excitation coil 61, a normally closed or break contact 63, a normally open or make contact 64, a common center terminal 65, also known as a root, and a movable switching member 62. Preferably, a second changeover switch 70 is provided having an excitation coil 71, a normally closed or break contact 73, a normally open or make contact 74, a common center terminal 75, which may also be referred to as a root, and a movable switching member 72. The two changeover switches 60, 70 may each be provided as changeover relays.

As can be further seen in FIG. 1A, the two changeover switches 60 and 70 are electrically connected to each other via their two common center terminals 65 and 75. The changeover switches 60 and 70 are connected such that the normally open contacts 64 and 74 of the two changeover switches 60 and 70 are arranged in series with each other in the load current path 130. It is apparent that in the exemplary safety switching apparatus 10, the electrical load 200 can only be started or connected to the voltage source 120 when the load current path 130 is closed by means of the two normally open contacts 64 and 74.

As shown in FIG. 1B, the excitation coil 61 of the first changeover switch 60 is arranged in a first control current path 90 electrically connected to the first input 91, while the normally closed contact 63 of the first changeover switch 60 is arranged in a first diagnostic circuit 30, as shown in FIG. 1A. The excitation coil 71 of the second changeover switch 70 is arranged in a second control current path 100 electrically connected to the second input 101, as shown in FIG. 1B, while the normally closed contact 73 of the second changeover switch is arranged in a second diagnostic circuit 31, as shown in FIG. 1A.

The first diagnostic circuit 30 and the second diagnostic circuit 31 are connected in parallel to the test voltage supply device 20 respectively to the test voltage provided by the AC/DC converter 23. Preferably, the positive terminal of the AC/DC converter 23 is electrically connected to both roots 65 and 75 of the changeover switches 60 and 70.

Furthermore, a first diagnostic current detection device 40 is associated with the first diagnostic current 30 or is operatively connected thereto. The diagnostic current detection device 40 is advantageously adapted to provide a first control signal only when the first diagnostic circuit 30 is closed by means of the normally closed contact 63 of the first changeover switch 60. Preferably, the first diagnostic current detection device 40 comprises an optocoupler constructed of an LED 41 or a laser diode and a phototransistor 42. According to the exemplary implementation, the LED 41 is arranged in the first diagnostic circuit 30, wherein the anode of the LED 41 is connected to the normally closed contact 63, while the cathode of the LED 41 is connected to the ground of the AC/DC converter 23, for example. According to the exemplary implementation, a diagnostic current consequently flows through the first diagnostic circuit 30 as soon as the normally closed contact 63, which acts as a break contact, is closed. In this case, the LED 41 emits light, causing the phototransistor 42 to become conductive. For example, as shown in FIG. 1A, one terminal of the phototransistor 42 is connected to ground.

Similarly, a second diagnostic current detection device 50 is associated with or is operatively connected to the second diagnostic circuit 31. The second diagnostic current detection device 50 may also again comprise an optocoupler comprising an LED 51 or a laser diode and a phototransistor 52. According to the exemplary implementation, the LED 51 is arranged in the second diagnostic circuit 31, wherein the anode of the LED 51 is connected to the normally closed contact or break contact 73 of the second changeover switch 70, while the cathode of the LED 51 is connected to the ground terminal of the AC/DC converter 23. In other words, the two diagnostic circuits 30 and 31 are connected in parallel to the DC output voltage, i.e., the test voltage, of the AC/DC converter 23. According to the exemplary implementation, a diagnostic current consequently flows through the first diagnostic circuit 31 as soon as the normally closed contact 73, which acts as a make contact, is closed. In this case, the LED 51 emits light so that the phototransistor 52 becomes conductive. As shown in FIG. 1A, one terminal of phototransistor 52 is connected to ground, for example.

The exemplary safety switching apparatus 10 preferably comprises a first controllable short-circuit device 80 shown in FIG. 1B. The first controllable short-circuit device 80 is electrically connectable to the second input 101. As will be explained in more detail later, a switching element 190, for example, is arranged in the control current path 100 for this purpose. Furthermore, a second controllable short-circuit device 110 is provided which is electrically connectable to the first input 91. For this purpose, as will be explained later, a switching element 180, for example, may be arranged in the first control circuit 90.

The first short-circuit device 80 is in particular adapted to short-circuit the excitation coil 61 of the first changeover switch 60 in response to a first activation signal applied to the second input only when the second diagnostic current detection device 50 provides the second control signal during a predetermined time period after the first activation signal is applied. According to the advantageous implementation, the first activation signal that can be applied to the input 101 is the DC voltage provided by the voltage source 103.

Similarly, the second short-circuit device 110 is preferably adapted, in response to a second activation signal applied to the first input 91, to short-circuit the excitation coil 71 of the second changeover switch 70 only when the first diagnostic current detection device 40 provides the first control signal during a predetermined time period after the second activation signal is applied. According to the exemplary implementation, the second activation signal is the DC voltage provided by the voltage source 93 and applied to the input 91. It should be noted already at this point that the first and second control signals of the first and second diagnostic current detection devices 40, respectively, are control signals that indicate that a diagnostic current is flowing in the first diagnostic circuit 30 and the second diagnostic circuit 31, respectively. As mentioned above, a diagnostic current only flows in the respective diagnostic circuits when the normally closed contact 63 or the normally closed contact 73 is closed.

The first short-circuit device 80 is advantageously constructed only by means of discrete electrical components. Preferably, the first short-circuit device 80 has a first switching element 81, which is preferably designed as an npn transistor. The collector terminal of the transistor 81 is connected to one terminal of the excitation coil 61, while the emitter terminal of the transistor 81 is connected to the second terminal of the excitation coil 61, which in turn is connected to ground. In this manner, the transistor 81 is connected in parallel with the excitation coil 61. In order that the npn transistor 81 becomes conductive only after the predetermined time period, a corresponding timing element is provided, which is advantageously designed as an RC element with a predetermined time constant. The time constant defines the predetermined time period. The RC element preferably comprises an electrical resistor 82 and a capacitor 84. Herein, one terminal of the electrical resistor 82 is connected to one terminal of the capacitor 84 and, for example, to one terminal of an electrical resistor 83, the further terminal of which is connected to the base terminal of the transistor 81, while a second terminal of the capacitor 84 is connected to ground. As can be seen in FIG. 1B, one terminal of the excitation coil 61 is connected to the emitter terminal of the transistor 81, which in turn is connected to ground. Further, the first short-circuit device 80 may comprise another switching element 85, which is again formed as a pnp transistor, for example. The collector terminal of the transistor 85 is connected to another terminal of the electrical resistor 82. The base terminal of the transistor 85 is connected to a further terminal of the phototransistor 52, as can be seen by looking at FIGS. 1A and 1B together. The emitter terminal of the second transistor 85 is connected to the second control current path 100 and in this way to a terminal of the excitation coil 71. It should be noted already at this point that the second terminal of the excitation coil 71 is connected to ground.

The second short-circuit device 110 is also advantageously constructed only by means of discrete electrical components. Preferably, the second short-circuit device 110 has a first switching element 111, which is preferably formed as an npn transistor. The collector terminal of the transistor 111 is connected to one terminal of the excitation coil 71, while the emitter terminal of the transistor 111 is connected to the second terminal of the excitation coil 71, which in turn is connected to ground. In this manner, the transistor 111 is connected in parallel with the excitation coil 71. In order that the npn transistor 111 becomes conductive only after the predetermined time period, a corresponding timing element is provided, which is advantageously designed as an RC element with a predetermined time constant. The predetermined time constant defines the predetermined time period. The RC element preferably comprises an electrical resistor 112 and a capacitor 114. Herein, one terminal of the electrical resistor 112 is connected to one terminal of the capacitor 114 and, for example, to one terminal of an electrical resistor 113 whose further terminal is connected to the base terminal of the transistor 111, while a second terminal of the capacitor 114 is connected to ground. As can be seen in FIG. 1B, one terminal of the excitation coil 71 is connected to the emitter terminal of the transistor 111, which in turn is connected to ground. Further, the second short-circuit device 110 may comprise another switching element 115, which is again formed as a pnp transistor, for example. The collector terminal of the transistor 115 is connected to another terminal of the electrical resistor 112. The base terminal of the transistor 115 is connected to a further terminal of the phototransistor 42, as can be seen by looking at FIGS. 1A and 1B together. The emitter terminal of the second transistor 115 is connected to the first control current path 90, and in this manner to a terminal of the excitation coil 61. It should be noted already at this point that the second terminal of the excitation coil 61 is connected to ground.

Figure 2:
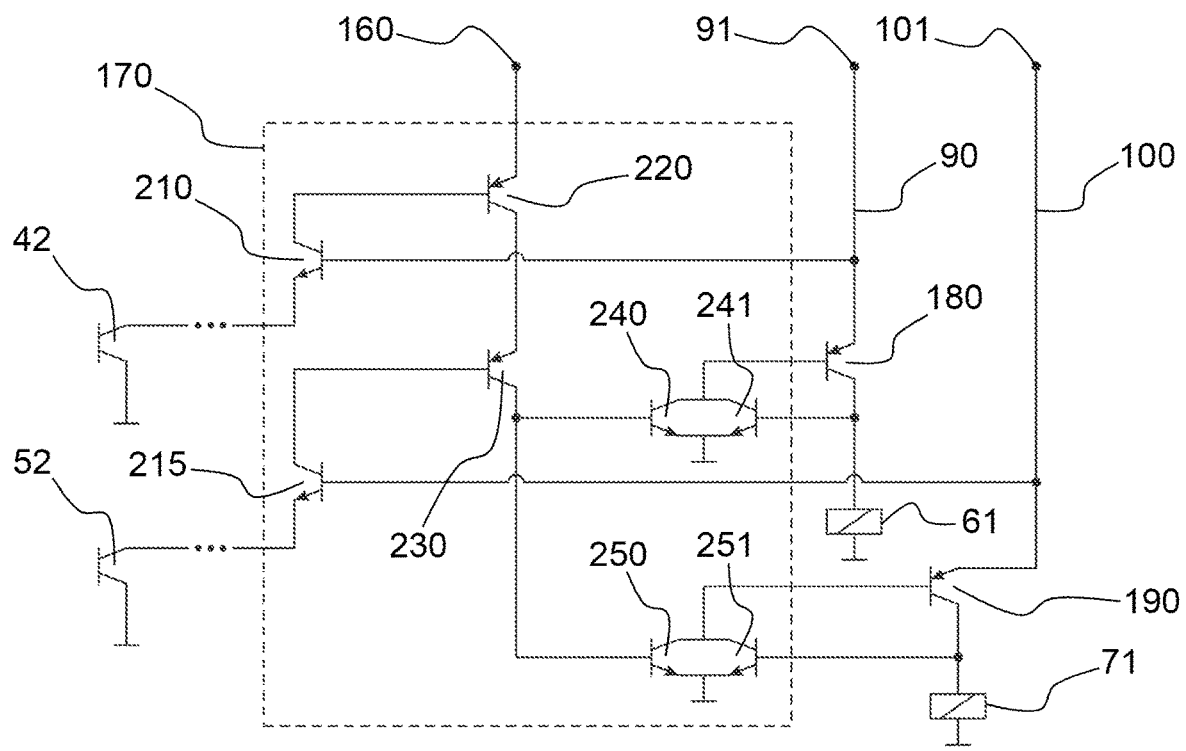

As mentioned above, the switching element 180 may be connected in the first control current path 90. The switching element 180 is preferably formed as a pnp transistor with its base terminal connected to an output of a logic circuit 170. An exemplary implementation of the logic circuit 170 is shown in FIG. 2 and will be explained in more detail below. An input of the logic circuit 170 is electrically connected to an input 160 of the safety switching apparatus 10. A start signal, for example a DC voltage, can be applied to the input 160, for example via a switch 161. Preferably, a DC voltage source 162 can be connected to the input 160 via the switch 161 for this purpose. As can be seen in FIG. 1B, the emitter terminal of the transistor 180 is connected to the first input 91, while the collector terminal is connected to a terminal of the excitation coil 61 and thus to the collector terminal of the transistor 81.

In addition, as mentioned above, the switching element 190 may be connected in the second control current path 100. The switching element 190 is preferably formed as a pnp transistor, the base terminal of which may be electrically connected to another output of the logic circuit 170. As can be seen in FIG. 1B, the emitter terminal of the transistor 190 is connected to the second input 101, while the collector terminal is connected to a terminal of the excitation coil 71 and thus to the collector terminal of the transistor 111.

As shown in FIG. 2, the exemplary logic circuit 170 may comprise eight switching elements 210, 215, 220, 230, 240, 241, 250, and 251. The switching elements 210 and 215, 240, 241, 250 and 251 may each be implemented as npn transistors, while the switching elements 220 and 230 may each be implemented as pnp transistors. For example, the two npn transistors 240 and 241 are interconnected such that their collector terminals are directly electrically connected to each other and their emitter terminals are directly electrically connected to each other and to ground. The two npn transistors 250 and 251, for example, are interconnected in the same manner so that their collector terminals are directly electrically connected to each other and their emitter terminals are directly electrically connected to each other and to ground.

According to an exemplary implementation of logic circuit 170, the emitter terminal of npn transistor 210 is electrically connected to phototransistor 42 and the emitter terminal of npn transistor 215 is electrically connected to phototransistor 52. The base terminal of npn transistor 210 is electrically connected to input 91 or current path 90, while the base terminal of npn transistor 215 is electrically connected to input 101 or current path 100. The collector terminal of npn transistor 210 is electrically connected to the base terminal of pnp transistor 220, while the collector terminal of npn transistor 215 is electrically connected to the base terminal of pnp transistor 230. Both pnp transistors 220 and 230 are connected in series, wherein the emitter terminal of pnp transistor 220, and thus logic circuit 170, is electrically connected to start input 160.

The collector terminal of the pnp transistor 220 is electrically connected to the emitter terminal of the pnp transistor 230. The collector terminal of pnp transistor 230 may be directly connected to the base terminal of npn transistor 240 and the base terminal of npn transistor 250. The collector terminals of npn transistors 240 and 241 may be electrically connected to the base terminal of pnp transistor 180, while the collector terminals of npn transistors 250 and 251 may be electrically connected to the base terminal of pnp transistor 190. The base terminal of npn transistor 241 may be electrically connected to the collector terminal of pnp transistor 180, while the base terminal of npn transistor 251 may be electrically connected to the collector terminal of pnp transistor 190. In this way, it is achieved that during a start-up operation, the functionality of the two changeover switches 60 and 70 is monitored simultaneously.

If, for example, a delay element (not shown) is connected upstream of the base terminal of the npn transistor 250, the functionality of the changeover switch 70 is checked first and then that of the changeover switch 60 during a starting operation. It should be noted once again that a starting operation preferably initiates the monitored switching on of the electrical and/or electronic load 200 and, in particular, the monitoring of the functionality of the changeover switches 60 and 70.

The exemplary logic circuit 170 ensures that the starting process of the safety switching apparatus 10 and, in particular, the monitoring of the functionality of the changeover switches 60 and 70 does not begin until the switches 92, 102 and 161 are closed and a control signal is supplied by each of the diagnostic current detection devices 40 and 50, which indicate that the normally closed contacts 63 and 73 are closed. In this respect, the logic circuit 170 implements an AND operation of the activation signals at the inputs 91 and 101, the start signal at the input 160 and the two control signals from the diagnostic current detection devices 40 and 50. Only when all these conditions are met does the start process begin.

It should also be noted that in FIGS. 1A and 1B, it is symbolically illustrated by a dashed line of action in each case that the excitation coil 71 acts on the movable switching member 72, while the excitation coil 61 acts on the movable switching member 62 of the changeover switch 60.

In the following, the mode of operation of the exemplary safety switching apparatus 10 shown in FIGS. 1A, 1B and 2 is explained in more detail in connection with a starting process. First, it should be noted that the following fault cases caVern be detected with the aid of the two series-connected, non-forcibly guided changeover switches 60 and 70:
1. a welding of the respective normally closed contact,
2. a welding of the respective normally open contact,
3. a short circuit in the first changeover switch 60 and in the second changeover switch 70, which results from a fuse melting of the respective normally closed and normally open contacts 62, 63, 64 and 72, 73, 74, respectively, and
4. a short circuit in the diagnostic current detection device 40 or the phototransistor 42 and/or the diagnostic current detection device 50 or the phototransistor 52.

According to an advantageous implementation, the exemplary logic circuit 170 shown in FIG. 2 may be used to initiate and control a startup process. Advantageously, the logic circuit 170 operates as follows:

When the two diagnostic current detection devices 40 and 50 each provide a control signal indicating that the first diagnostic circuit 30 respectively the second diagnostic circuit 31 is closed, and in addition the switching elements 92, 102, 161 are closed, for example
  the pnp transistor 180 is set to the conductive state, whereby the testing of the first changeover switch 60 (as already described above) is started, and
  and at the same time the pnp transistor 190 is set to the conductive state, whereby the testing of the second changeover switch 70 (as described above) is started.

If no fault is detected with respect to the changeover switches 60 and 70 during the two-stage test or diagnostic phase, the load 200 is properly switched on or connected to the supply voltage source 120. Otherwise, the excitation coil of the functional changeover switch is short-circuited.

The monitored switching on of the electrical and/or electronic load 200 is explained in more detail below.

Let it now be assumed that the safety switching apparatus 10 is to be started, i.e. the electrical and/or electronic load 200 is to be connected to the supply voltage, i.e. to the supply voltage source 120. Further, let it be assumed that the pushbuttons 92 and 102, which may each be designed as sensors or signalling devices, are initially in the open state. Consequently, no supply voltage is present at the inputs 91 and 101 and the excitation coils 61 and 71 are not energized. Further, let it be assumed that, as a result, the two normally closed contacts 63 and 73, which act as break contacts, are in the closed state, so that a diagnostic current flows in both the first and second diagnostic circuits 30 and 31.

According to an advantageous scenario, it is now assumed that the two pushbuttons 92 and 102 are actuated to initiate the start process, so that the supply voltage provided by voltage source 93 is fed to input 91 and the supply voltage provided by voltage source 103 is fed to input 101. Furthermore, let it be assumed that switch 161 is also closed so that a start signal is applied to input 160, which in the present example is supplied by DC voltage source 162. This means that a DC voltage is present at the collector terminal of the pnp transistor 220, the DC voltage supplied by the voltage source 93 is present at the base terminal of the npn transistor 210, and the DC voltage supplied by the voltage source 103 is present at the base terminal of the npn transistor 215, so that the two transistors 210 and 215 are set to be conductive. Consequently, the base terminal of each of the pnp transistors 220 and 230 has ground potential as a control signal which is supplied through the phototransistor 42 and npn transistor 210 and the phototransistor 52 and the pnp transistor 215, respectively.

Accordingly, the DC voltage applied to input 160 as a start signal is firstly applied to the base terminal of npn transistor 240 and the base terminal of npn transistor 250 via pnp transistors 220 and 230. Consequently, ground potential is applied to the base terminal of pnp transistor 180 via transistors 240 and 241, and ground potential is applied to the base terminal of pnp transistor 190 via transistors 250 and 251, so that pnp transistors 180 and 190 become conductive and excitation coil 61 is energized via supply voltage source 93 and excitation coil 71 is energized via supply voltage source 103. As a result, in proper operation, the normally closed contact 63 of the changeover switch 60 is opened via the movable switching member 62 and the normally open contact 64 is closed, and the normally closed contact 73 of the changeover switch 70 is opened via the movable switching member 72 and the normally open contact 74 is closed. As a result, the diagnostic circuits 30 and 31 are opened and no more diagnostic current flows, which is detected by the diagnostic current detecting means 40 and 50, respectively. Consequently, the phototransistors 42 and 52 enter the blocking state. This further causes the transistor 115 of the second short-circuit device 110 to block, thereby deactivating the short-circuit device 110. Similarly, the transistor 85 of the first short-circuit device 80 blocks, thereby deactivating the short-circuit device 80. In this proper operation, the two normally open contacts 64 and 74 are closed and thus the electrical load 200 is properly connected to the supply voltage source 120.

Assume now, by way of example, that the changeover switch 70 is operating properly and therefore the short-circuit device 110 is not activated. However, due to a fault, the normally closed contact 63 does not open after the switches 161, 102 and 92 are closed, so that a diagnostic current continues to flow in the first diagnostic circuit 30, causing the phototransistor 42 to be held in the conductive state. As a result, the ground potential across phototransistor 42 is applied to the base terminal of transistor 115 of short-circuit device 110, which then activates short-circuit device 110. Since the transistor 115 is now conductive, the current flowing through the control circuit 90 is conducted through the collector-emitter path of the transistor 115 into the RC element 112/114, whereupon the capacitor 114 is charged. If the normally closed contact 63 remains closed during the time period defined by the RC element 112/114, the capacitor 114 charges to such an extent that the transistor 111 becomes conductive after the predetermined time period has elapsed, thereby short-circuiting the excitation coil 71, regardless of whether the second control current path 100 is open or closed. In this way, a starting process, i.e. switching on or connecting to the supply voltage 120 of the electrical load 200, is prevented, since not only the normally open contact 64 remains open due to a fusing of the normally closed contact 63, but in addition the excitation coil 71 of the second changeover switch 70 is short-circuited. In any case, the safety switching apparatus 10 remains in a safe state even when the switch or signaling device 102 is closed, whereby the second control current path 100 is energized via the supply voltage source 103.

A second possible fault that can be detected with this particular safety switching apparatus 10 is that an electrical short circuit has occurred, for example, between the movable switching member 62, the normally closed contact 63 and the normally open contact 64 of the first changeover switch 60. In this case, the normally open contact 64 arranged in the load circuit 130 is already closed, even if no starting operation has yet been initiated.

If this fault condition exists, the excitation coil 61 is energized via the control current path 90 after the switches 92, 102 and 161 are closed. However, a diagnostic current still flows in the first diagnostic circuit 30 because the normally closed contact 63 also remains closed. As a result, the control signal, e.g., ground potential, which continues to be provided via the phototransistor 42, causes the pnp transistor 115 to be in the conductive state so that the control current flowing in the control circuit 90 via the transistor 115 of the short-circuit device 110 charges the capacitor 114 during the predetermined time period defined by the time constant of the RC element 112, 114 to such an extent that the transistor 111 is set to be conductive and, consequently, the excitation coil 71 is short-circuited. This means that even if a start signal is applied to input 160 and an activation signal, namely the DC voltage of supply voltage source 103, is applied to input 102, and thus the second control current path 100 is closed, the excitation coil 71 is not energized, and thus the normally open contact 74 of the second changeover switch 70 remains open. Consequently, the load circuit 130 remains open and thus the safety switching apparatus 10 respectively the load 200 remains in a safe state even though the changeover switch 60 can no longer be operated properly due to a short circuit.

The safety switching apparatus 10 operates similarly, if the changeover switch 70 is defective and changeover switch 60 is operating properly and therefore the short-circuit device 80 is not activated.

Since the normally closed contact 73 now does not open after the switches 161, 102 and 92 are closed due to a fault, a diagnostic current continues to flow in the first diagnostic circuit 40, which causes the phototransistor 52 to be held in the conductive state. As a result, ground potential across phototransistor 52 is applied to the base terminal of transistor 85 of short-circuit device 80, which then activates the short-circuit device 80. Since the transistor 85 is now conductive, the current flowing through the control circuit 100 is conducted via the collector-emitter path of the transistor 85 into the RC element 82/84, whereupon the capacitor 84 is charged. If the normally closed contact 73 remains closed for the time period defined by the RC element 82/84, the capacitor 84 charges to such an extent that the transistor 81 becomes conductive after the predetermined time period has elapsed, thereby short-circuiting the excitation coil 61, regardless of whether the first control current path 90 is open or closed. In this way, a starting process, i.e. switching on or connecting to the supply voltage 120 of the electrical load 200, is prevented, since not only the normally open contact 74 remains open due to a fusing of the normally closed contact 73, but in addition the excitation coil 61 of the second changeover switch 60 is short-circuited. In any case, the safety switching apparatus 10 remains in a safe state even when the switch or signaling device 92 is closed, thereby energizing the first control current path 90 via the supply voltage source 93.

The invention claimed is:

1. A safety switching apparatus for the monitored switching on of an electrical and/or electronic load, comprising:
   a first input and a second input, to each of which an activation signal can be applied;
   a third input, which is designed to apply a supply voltage for supplying power to the electrical load;
   a test voltage supply device;
   an output, which is designed to connect the electrical load, wherein a load current path extends between the third input and the output;
   first and second changeover switches each having an excitation coil, a normally closed contact, a normally open contact, and a common center terminal, wherein the first changeover switch and the second changeover switch are electrically connected to each other by means of the respective common center terminals, wherein the normally open contacts of the first and second changeover switches are arranged in series with each other in said load current path, wherein the excitation coil of the first changeover switch is arranged in a first control current path electrically connected to the first input, and the normally closed contact of the first changeover switch is arranged in a first diagnostic circuit, wherein the excitation coil of the second changeover switch is arranged in a second control current path electrically connected to the second input, and the normally closed contact of the second changeover switch is arranged in a second diagnostic circuit, wherein the first diagnostic circuit and the second diagnostic circuit are connected in parallel to the test voltage supply device;
   a first diagnostic current detecting device associated with the first diagnostic circuit and adapted to provide a first control signal only when the first diagnostic circuit is closed by means of the normally closed contact of the first changeover switch;
   a second diagnostic current detecting device associated with the second diagnostic circuit and adapted to provide a second control signal only when the second diagnostic circuit is closed by means of the normally closed contact of the second changeover switch;
   a first controllable short-circuit device electrically connectable to the second input; and
   a second controllable short-circuit device electrically connectable to the first input, wherein the first short-circuit device is adapted to short-circuit the excitation coil of the first changeover switch in response to a first activation signal applied to the second input only when the second diagnostic current detecting device provides the second control signal during a predetermined time period after the first activation signal is applied, and wherein the second short-circuit device is adapted to short-circuit the excitation coil of the second changeover switch in response to a second activation signal applied to the first input only when the first diagnostic current detection device provides the first control signal during a predetermined time period after the second activation signal is applied.

2. The safety switching apparatus of claim 1, wherein the first and second diagnostic current detection devices each comprises an optocoupler.

3. The safety switching apparatus according to claim 1, wherein the test voltage supply device comprises a transmitter or transformer.

4. The safety switching apparatus according to claim 3, wherein the transmitter is connected on the primary side to a DC/AC converter or an AC/AC converter and on the secondary side to an AC/DC converter.

5. The safety switching apparatus according to claim 1, wherein the first short-circuit device comprises a switching element for short-circuiting the excitation coil of the first changeover switch and an RC element dimensioned to define the predetermined time period, and wherein the second short-circuit device comprises a switching element for short-circuiting the excitation coil of the second changeover switch and an RC element dimensioned to define the predetermined time period.

6. The safety switching apparatus according to claim 1, further comprising:
   a first switching element connected in series with the excitation coil of the first changeover switch, the first switching element being adapted to open and close the first control current path; and
   a second switching element connected in series with the excitation coil of the second changeover switch, the second switching element adapted to open and close the second control current path; and
   a logic circuit adapted to close the first switching element and the second switching element only when the first and second activation signals, a start signal, and the first and second control signals are simultaneously applied to the logic circuit;
   wherein the first short-circuit device is adapted to short-circuit the excitation coil of the first changeover switch only when the second diagnostic current detecting device still provides the second control signal during the predetermined time period after the second switching element is closed; and
   wherein the second short-circuit device is adapted to short-circuit the excitation coil of the second changeover switch only when the first diagnostic current detecting device still provides the second control signal during the predetermined time period after the first switching element is closed.

7. The safety switching apparatus according to claim 6, wherein the logic circuit is adapted to close the first switching element and, with a time delay, the second switching element, or vice versa.

8. The safety switching apparatus of claim 6, wherein the first short-circuit device comprises a further switching element having a first terminal electrically connected to the output of the second diagnostic current detection device and a second terminal electrically connectable to the second input, and wherein the second short-circuit device comprises a further switching element having a first terminal electrically connected to the output of the first diagnostic current detection device and a second terminal electrically connectable to the first input.

* * * * *